United States Patent
Kuroda et al.

(10) Patent No.: US 7,206,105 B2
(45) Date of Patent: Apr. 17, 2007

(54) HOLOGRAM RECORDING DEVICE AND HOLOGRAM REPRODUCTION DEVICE

(75) Inventors: Kazuo Kuroda, Tsurugashima (JP); Satoshi Sugiura, Tsurugashima (JP); Shuuichi Yanagisawa, Tsurugashima (JP); Satoru Tanaka, Tsurugashima (JP); Yoshihisa Itoh, Tsurugashima (JP); Akihiro Tachibana, Tsurugashima (JP); Yoshihisa Kubota, Tsurugashima (JP)

(73) Assignee: Pioneer Corporation, Tokyo (JP)

(*) Notice: Subject to any disclaimer, the term of this patent is extended or adjusted under 35 U.S.C. 154(b) by 168 days.

(21) Appl. No.: 10/514,826

(22) PCT Filed: May 19, 2003

(86) PCT No.: PCT/JP03/06205

§ 371 (c)(1),
(2), (4) Date: Nov. 17, 2004

(87) PCT Pub. No.: WO03/098360

PCT Pub. Date: Nov. 27, 2003

(65) Prior Publication Data
US 2005/0185230 A1    Aug. 25, 2005

(30) Foreign Application Priority Data
May 17, 2002   (JP)   ............... 2002-143767

(51) Int. Cl.
G02B 1/02    (2006.01)

(52) U.S. Cl. ................. 359/3; 359/35; 359/24

(58) Field of Classification Search ............ 359/3, 359/4, 22, 24, 30, 239, 259
See application file for complete search history.

(56) References Cited

U.S. PATENT DOCUMENTS

| 6,064,586 A | 5/2000 | Snyder et al. |
| 6,661,725 B2 * | 12/2003 | Roh ............... 365/216 |
| 6,697,316 B2 * | 2/2004 | Burr ............... 369/103 |
| 2004/0145994 A1 * | 7/2004 | Tsukagoshi ........ 369/103 |

FOREIGN PATENT DOCUMENTS

JP    9-197947    7/1997

* cited by examiner

Primary Examiner—Fayez G. Assaf
(74) Attorney, Agent, or Firm—Young & Thompson

(57) ABSTRACT

A hologram record apparatus (100) includes a spatial light modulator (15) and a control device (18). The spatial light modulator (15) is arranged on an optical path of signal light (L1) and divided into a plurality of cell blocks (151) arranged in a matrix. Each of the cell blocks (151) is further divided into a plurality of cells (152) arranged in a matrix. The spatial light modulator (15) can perform modulation on the cell basis. The control device (18) controls the spatial light modulator so as to modulate the signal light according to a plurality of record information sets to be recorded on a hologram record medium (200). Pluralities of modulation units (153) existing in the same cell block are not made into identical patterns. Since a plurality of cell blocks having a large pitch as compared to the pixel pitch are simultaneously or successively turned on/off, it is possible to reduce the distance between the zeroth-order light and the higher-order light.

16 Claims, 10 Drawing Sheets

(a)

(b)

(c)

(a)

(b)

(c)

HOLOGRAM RECORDING DEVICE AND HOLOGRAM REPRODUCTION DEVICE

TECHNICAL FIELD

The present invention relates to a hologram record apparatus for irradiating a hologram record medium with signal light via a spatial light modulator to record information and a hologram reproduction apparatus for reproducing the information from the hologram record medium.

BACKGROUND ART

Heretofore, a hologram record apparatus, which may be provided with a liquid crystal device and the like, irradiates a spatial light modulator for modulating light depending on record information to be recorded, with laser light as signal light. Particularly, in the spatial light modulator, cells are arranged planarly in a matrix so that the signal light is modulated by changing transmittance of each cell depending on the record information. The modulated light is outputted with various different output angles, as a plurality of diffraction light, such as zeroth-order light, or first-order light and so on, due to diffraction phenomenon in the cell having a fine pitch. In this case, the output angle is defined by the cell pitch, which indicates a modulation unit. Then, the signal light modulated with the spatial light modulator constructed as above and the reference light not passed through the spatial light modulator are interfered to each other in the hologram record medium. Thereby, the record information is recorded as a wavefront in the hologram record medium.

According to the hologram record apparatus constructed as such, for example, the record area of about 1 mm in diameter on the recording medium is irradiated with the zeroth-order light and the first-order light (e.g. one of the plurality of first-order lights) as the signal light from the spatial light modulator. In this case, individual recordings can be performed by changing parameters such as an irradiation angle of the signal light relative to the record medium. For this, the information can be recorded at high density.

DISCLOSURE OF INVENTION

However, if a cell size or pixel pitch size of the spatial light modulator becomes smaller, the difference of the output angle between the diffraction zeroth-order light and the diffraction first-order light, and thereby a focus position pitch on the hologram record medium, becomes wider. Thereby, a record surface area of the hologram record medium irradiated with these diffraction lights needs to be enlarged. Alternatively, the spatial light modulator and the optical systems at the output side need to be enlarged. Particularly, in order to record over a wide surface area of the record area, a powerful light source such as a high power semiconductor laser device is required, which is extremely disadvantageous from a practical viewpoint including cost. Therefore, if the cell size or pixel pitch size of the spatial light modulator becomes smaller, it is difficult as a matter of practice to downsize the hologram record apparatus or improve the record density.

On the other hand, if the cell size or pixel pitch size becomes bigger, the difference of the output angle between the zeroth-order light and the first-order light or the pitch between them becomes smaller but record capacity or information volume to be recorded onto the hologram record medium fundamentally decreases because the cell or pixel pitch increases.

As mentioned above, in the hologram record apparatus and the hologram reproduction apparatus, it is theoretically or technically difficult to satisfy various needs at the same time, such as a need for downsizing the apparatus, a need for improving the record density, a need for increasing the storage capacity, a need for saving the power of the light source, a need for simplifying the apparatus structure or apparatus control.

The present invention has been accomplished in view of above problems. It is therefore an object of the present invention to provide a hologram record apparatus and a hologram reproduction apparatus capable of improving the record density and the record capacity, and suitable for downsizing.

The hologram record apparatus of the invention in order to solve the above problems is a hologram record apparatus provided with: a record light source for performing an irradiation with source light including signal light and reference light; a spatial light modulator disposed in an optical path of the signal light and divided into a plurality of cell blocks arranged in a matrix, each cell block divided into a plurality of cells arranged in a matrix of M by N (M, N=natural number not less than 2); an optical system for introducing the signal light passed through the spatial light modulator and the reference light onto a hologram record medium; and a control device for controlling the spatial light modulator to modulate the signal light using one or more cells occupying a part of each cell block as modulation units, depending on each of a plurality of record information to be recorded onto the hologram record medium, wherein the control device controls the spatial light modulator to record the plurality of record information overlappingly one after another, in each of a plurality of record areas corresponding to the plurality of cell blocks on the hologram record medium, by using the signal light modulated by the modulation units, and the modulation units exist in each cell block and have different cell patterns respectively.

According to the hologram record apparatus of the present invention, during the operation, the record light source such as the semiconductor laser device performs the irradiation with the source light such as laser light. The source light includes the signal light and the reference light. Here, the spatial light modulator, consisting of a liquid crystal device for example, disposed in the optical path of the signal light modulates the signal light, on the basis of modulation units made of one or more cells occupying a part in each cell block, depending on each of the plurality of record information to be recorded, under control of the control device. Then, the optical system introduces the modulated signal light and the reference light onto the hologram record medium. As the result, the record information is recorded as a wavefront, due to the interference between the signal light and the reference light.

Incidentally, the signal light and the reference light included in the source light may be split from each other by the optical system such as a beam splitter and then the signal light may be introduced to enter the spatial light modulator and the reference light may be introduced not to enter the spatial light modulator. Alternatively, the signal light and the reference light included in the source light may be introduced to enter the spatial light modulator without split from each other. In the latter case, Fourier zeroth-order component of the signal light outputted from the spatial light modulator may be functioned as the reference light, for example by employing a so-called "self-coupling scheme". In this case, the reference light may not have the phase information.

Here, the spatial light modulator is divided into a plurality of cell blocks arranged in a matrix. Furthermore, the cell block is divided into a plurality of cells arranged in a matrix of M by N. Each of a plurality of modulation units existing in the same cell block consists of one or more cells defined to have a cell pattern different from each other. For example, each cell block is made of "5 by 5" cell arrangement (M=N=5), in which the modulation unit is made of "4 by 4" or "3 by 3" cell arrangement in each cell block, each modulation unit having a cell pattern different from each other. Alternatively, for example, each cell block is made of "5 by 5" cell arrangement (M=N=5), in which the modulation unit is made of one cell, each modulation unit having a cell pattern different from each other.

The spatial light modulator constructed as such, modulatable cell by cell, during the operation, records a plurality of record information overlappingly one after another, in the same record area on the hologram record medium corresponding to the same cell block, under control of the control device.

Then, these operations for overlappingly and sequentially recording a plurality of record information in the same record area corresponding to the same cell block are performed simultaneously or one after another for each of a plurality of cell blocks in the spatial light modulator. For example, these sequential recording operations based on the modulation units are performed simultaneously or one after another for all the cell blocks in a matrix of 65 by 65.

Incidentally, it is possible to set the record surface area of the hologram record medium relatively bigger than the signal light, so that the recordings for the plurality of record areas corresponding to the plurality of cell blocks are performed for a part of the hologram record medium, and then the similar recordings are performed for other parts of the hologram record medium. Alternatively, after these recordings for a plurality of record areas corresponding to a plurality of cell blocks, recordings for the plurality of same record areas may be performed by changing the angle of the signal light, or the phase or amplitude of the reference light.

As the result, according to the present invention, the diffraction extent of the signal light at the spatial light modulator, i.e. the difference-of output angle of the zeroth-order light or the higher-order light such as the first-order light, the second-order light etc. is defined by a relatively large pitch in the cell block. For this, the diffraction extent, i.e. the difference of the output anglo of the zeroth-order light or the higher-order light such as the first-order light or second-order light can be remarkably minimized, in comparison with a hologram record apparatus in which the diffraction is defined by a relatively small pitch of an individual cell. On the other hand, a plurality of record information modulated based on a plurality of modulation units included in the same cell block is recorded overlappingly one after another in the same record area corresponding to the same cell block. For this, the record density can be improved almost equally to the case of recording based on an individual cell.

Thus, according to the present invention, the record density can be improved, and thereby the record capacity can be increased, while the optical system such as the spatial light modulator or optical systems, or the surface area of the hologram record medium can be minimized in their sizes and thereby the entire apparatus can be downsized and lightened. Furthermore, the record light source requires sufficiently relatively weak intension, which is very advantageous in view of cost and so on. Additionally, in comparison with cases of multiplex-recordings in aforementioned various types of recording, the apparatus structure or the control thereof can be simplified, because the recordings can be performed overlappingly one after another in the same record area without changing the optical path, phase or the like of the signal light or the reference light.

In an aspect of the hologram record apparatus according to the present invention, the spatial light modulator performs the recordings of the plurality of record information in parallel for each cell block.

According to this aspect, performing the recording in parallel for each cell block makes the benefit of the hologram record medium as a distributed type memory.

However, depending on the size or the like of the optical system or the spatial light modulator such as the liquid crystal device, for example, a series of operations for the sequential recordings based on the modulation units in each cell block may be performed on the basis of a plurality of cell blocks that is not a whole part, or on the basis of an individual cell block.

In another aspect of the hologram record apparatus according to the present invention, each modulation unit is made of cells arranged in a predetermined pattern in each cell block.

According to this aspect, the recording is performed by modulating the signal light on the basis of modulation units each made of cells arranged in a predetermined pattern in each cell block. For this, if a relationship between the light pattern or the light intensity distribution that were expected to be obtained during the reproduction, corresponding to each predetermined pattern and each modulation unit or the record information contents (e.g. "0" or "1" in a binary digit, or multi-level obtained by adding a mid-level to the binary digit) recorded on the basis of each modulation unit is predetermined experimentally, empirically, theoretically, mathematically or by a simulation, the record information recorded in each record area can be identified for each modulation unit when the hologram record medium is actually reproduced, and further the record information contents can be identified. That is, the record information can be reproduced from the hologram record medium.

In this aspect, each modulation unit may be made of cells arranged in a matrix of n by m (n=natural number not more than N, m=natural number not more than M, and n+m<N+M).

In this arrangement, a predetermined pattern of each modulation unit is a rectangular or square pattern in a matrix of n by m smaller than another rectangular or square of the cell block. For this, the relationship between the light pattern expected to be obtained during the reproduction corresponding to the predetermined pattern and the record information contents recorded on the basis of the modulation units can be identified experimentally, empirically or theoretically otherwise from a simulation. Then, the number of the record information recordable in the record area corresponding to the same cell block can be increased, by overlapping the rectangular or square patterns on each other. From these, the record information can be recorded at high density onto the hologram record medium, and the record information is ensured to be reproduced.

Alternatively, in another aspect of the hologram record apparatus, each modulation unit is made of an individual cell in each cell block.

According to this aspect, the recording is performed by modulating the signal light on the basis of the modulation units each made of the individual unit in each cell block. For this, if a relationship between the light pattern or the light intensity distribution that were expected to be obtained during the reproduction, corresponding to each individual cell and each modulation unit or the record information contents (e.g. a binary digit such as "0" or "1", or multi-level value obtained by adding mid-scale value to the binary digit) recorded on the basis of each modulation unit is predetermined experimentally, empirically, theoretically or by a simulation, the record information recorded in each record area can be identified for each modulation unit when the hologram record medium is actually reproduced, and the record information contents can be identified. That is, the record information can be reproduced from the hologram record medium.

In another aspect of the hologram record apparatus according to the present invention, the control device controls the spatial light modulator to perform a binary modulation depending on binary data indicated by the record information by using the modulation units.

According to this aspect, the record information indicating the binary data can be recorded at high density onto the hologram record medium.

Alternatively, in another aspect of the hologram record apparatus according to the present invention, the control device controls the spatial light modulator to perform a multi-value level modulation depending on gray scale data indicated by the record information by using the modulation units.

According to this aspect, the record information indicating the gray scale data can be recorded at high density onto the hologram record medium.

Incidentally, in another aspect of the hologram record apparatus according to the present invention, the apparatus may further be provided with: an optical system disposed in a signal optical path before the spatial light modulator for enlarging a signal light diameter; and an optical system disposed in the signal optical path after the spatial light modulator for changing the signal light diameter. In this arrangement, independent of a relatively small source light diameter such as a semiconductor laser light diameter, the diameter of the signal light passing through the spatial light modulator disposed between both optical systems can be controlled depending on the size of the spatial light modulator. Therefore, the flexibility in the specification of the spatial light modulator that may be made of the liquid crystal device is increased, and the spatial light modulator having cells in a required number for the hologram record apparatus is easily presented. Additionally, these optical systems can control the angle or the like of the signal light, or can make a change for the angle-multiplex recording.

In another aspect of the hologram record apparatus according to the present invention, at least one of an angle-multiplex system for performing multiple recordings by changing an incidence angle of the signal light entering the hologram record medium, a reference light phase-multiplex system for performing multiple recordings by changing a phase of the reference light, a reference light amplitude-multiplex system for performing multiple recordings by changing an amplitude of the reference light, a reference light polarization-multiplex system for performing multiple recordings by changing a polarization of the reference light, and a focal depth-multiplex system for performing multiple recordings by changing a focal depth of the signal light entering the hologram record medium is performed to the same record area.

According to this aspect, integrating various multi-recordings into the record operation of the hologram record apparatus of the invention makes it possible to perform the hologram recording at high density.

The hologram reproduction apparatus of the present invention in order to solve the above problems is a hologram reproduction apparatus for reading the record information from the hologram record medium recorded by the aforementioned hologram record apparatus (including various aspects thereof). The hologram reproduction apparatus is provided with: a reproduction light source for irradiating the hologram record medium with reference illumination light; a photoreceptor for receiving reproduction light based on the reproduction illumination light from the same record area corresponding to the same cell block of the hologram record medium; and a reading device for reading the plurality of record information recorded overlappingly in the same record area, on the basis of the received reproduction light.

According to the hologram reproduction apparatus of the invention, during the operation, the reproduction light source such as the semiconductor laser irradiates the reproduction illumination light such as laser beam. Then, the photoreceptor, including a photodiode array, a CCD (Charge Coupled Device) and the like, receives the reproduction light which is based on the reproduction illumination light and which is obtained from the same record area corresponding to the same cell block of the hologram record medium. Then, receiving the reproduction light by the photoreceptor is preferably performed simultaneously for some or all of cell blocks. The "reproduction light" herein means the zeroth-order light or the higher-order light such as the first-order light, caused when the reproduction illumination light corresponding to the reference light for the recording is irradiated onto the hologram record medium. Then, on the basis of the reproduction light received by the photoreceptor, the reading device reads a plurality of record information recorded overlappingly in the same record area. More specifically, on the basis of the reproduction light, the modulation units recorded overlappingly in the same record area are identified, and the contents of the record information recorded for each modulation unit are identified. Then, identifying the modulation units and the record information contents by the reading device is preferably performed simultaneously for some or all of the record areas on the hologram record medium corresponding to some or all of cell blocks. From these, each record information recorded at high density onto the hologram record medium is reproduced.

In an aspect of the hologram reproduction apparatus according to the present invention, the photoreceptor receives simultaneously the reproduction lights corresponding to the plurality of record information recorded overlappingly in the same record area, and the reading device reads simultaneously the plurality of record information recorded overlappingly in the same record area, on the basis of the simultaneously-received reproduction light.

According to this aspect, a plurality of record information recorded overlappingly one after another in the same record area corresponding to the same cell block on recording can be read simultaneously on reproduction, which allows the quick reading operation.

In another aspect of the hologram reproduction apparatus according to the present invention, the reading device reads the plurality of record information from the plurality of record areas corresponding to the plurality of cell blocks in parallel.

According to this aspect, performing the reproduction simultaneously or in parallel to the plurality of record areas on the hologram record medium makes effective use of the benefit of the hologram record medium as a distributed type memory. However, depending on the size of the photoreceptor such as a photodiode array or the size of the optical system, the reproduction may be performed sequentially for a group of record areas, or for an individual record area.

In another aspect of the hologram reproduction apparatus according to the present invention, the reading device detects a barycenter of a dark portion or a light portion of the received reproduction light from the same record area, and reads the plurality of record information modulated on the basis of the modulation units in the same cell block, on the basis of the detected barycenter.

According to this aspect, the record information can be read with high accuracy, by identifying in advance the relationship between the barycenter of the reproduction light for each record area corresponding to each cell block, and each modulation unit in each cell block as well as the contents of the record information recorded thereby, and using the barycenter alone or the combination with the light pattern of the received reproduction light, the light intensity distribution and the like on the reproduction.

In another aspect of the hologram reproduction apparatus according to the present invention, the reading device detects a light part which is included in the received reproduction light and which corresponds to a predetermined area in the same record area, and reads the record information on the basis of the detected light part.

According to this aspect, during the reproduction, the record information can be read with high accuracy, on the basis of the light part (e.g. the light pattern of the light part, the light intensity distribution, the barycenter of the dark or light portion) by identifying the relationship between the light part from the predetermined area (e.g. four corners) in the record area corresponding to the cell block, and each modulation unit in the cell block and the contents of the record information recorded thereby.

In another aspect of the hologram reproduction apparatus according to the present invention, the reading device detects a light-dark pattern of the reproduction light received from the same record area, and reads the plurality of record information modulated on the basis of the modulation units in the same cell block, on the basis of the detected light-dark pattern.

According to this aspect, during the reproduction, the record information can be read with high accuracy, on the basis of the light-dark pattern, by identifying in advance the relationship between the light-dark pattern of the reproduction light from the record area corresponding to the cell block, and each modulation unit in the cell block as well as the contents of the record information recorded thereby.

In another aspect of the hologram reproduction apparatus according to the present invention, the reading device detects an intensity distribution of the reproduction light received from the same record area, and reads the plurality of record information modulated on the basis of the modulation units in the same cell block, on the basis of the detected intensity distribution.

According to this aspect, during the reproduction, the record information can be read with high accuracy, on the basis of the intensity distribution, by identifying in advance the intensity distribution from the record area corresponding to the cell block, and each modulation unit in the cell block as well as the contents of the record information recorded thereby.

In this aspect, the record information indicates gray scale data subjected to a multi-value level modulation, and the reading device reads the gray scale data, on the basis of the detected intensity distribution.

In this arrangement, using the intensity distribution of the reproduction light allows the reproduction of the record information indicating the gray scale data. As the result, the record density can be further improved.

In another aspect of the hologram reproduction apparatus according to the present invention, the reading device detects total amount of the reproduction light received from the same record area, and reads the plurality of record information modulated on the basis of modulation units in the same cell block, on the basis of the detected total amount.

According to this aspect, during the reproduction, the record information can be read with high accuracy on the basis of the total amount of the light alone or the combination with the light pattern, the light intensity distribution and the like of the received reproduction light, by identifying in advance the relationship between the total amount of the reproduction light in the record area corresponding to the cell block, and each modulation unit in the cell block as well as the contents of the record information recorded thereby.

The above effects and other advantages of the present invention will be more apparent from the following explanation.

BEST MODE FOR CARRYING OUT THE INVENTION

Now, embodiments of the present invention will be explained, with reference to drawings.

(First Embodiment of Hologram Record Apparatus)

The first embodiment of the hologram record apparatus of the present invention will be discussed, with reference to FIG. 1 to FIG. 11.

Figure 1:
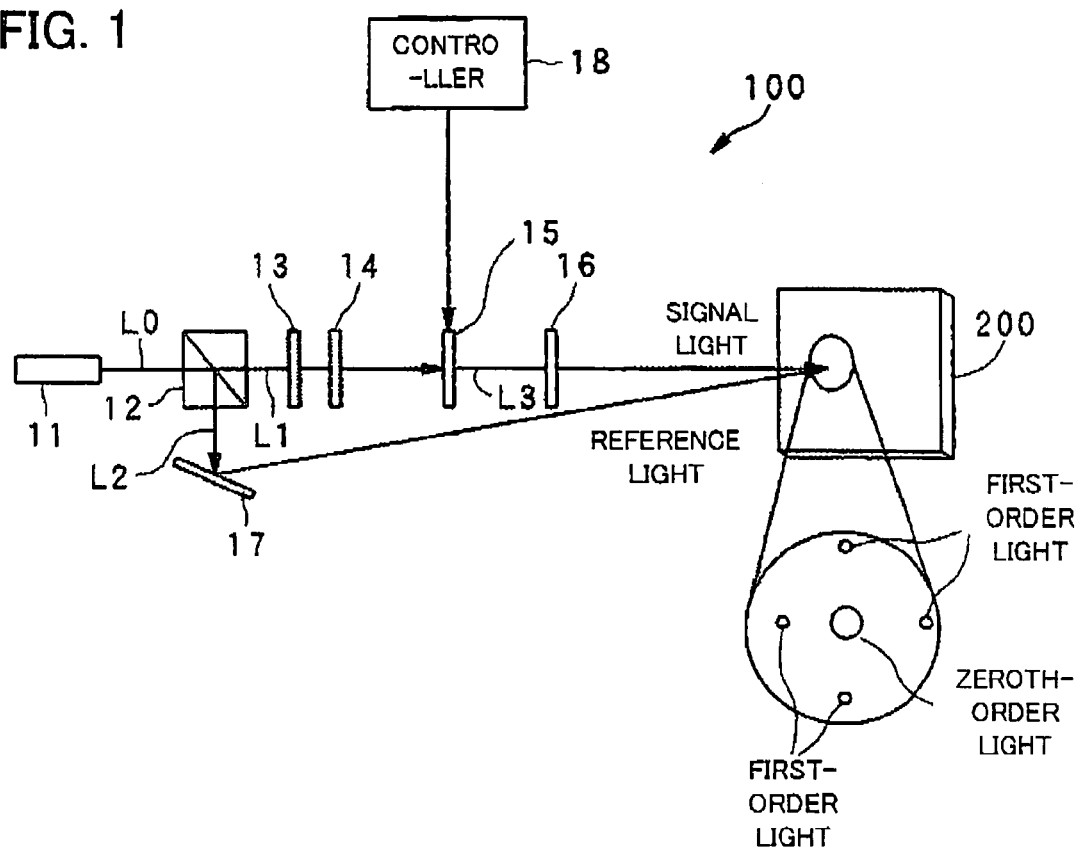
FIG. 1 is a block diagram illustrating an entire configuration of the first embodiment of the hologram record apparatus of the present invention.
Figure 2:
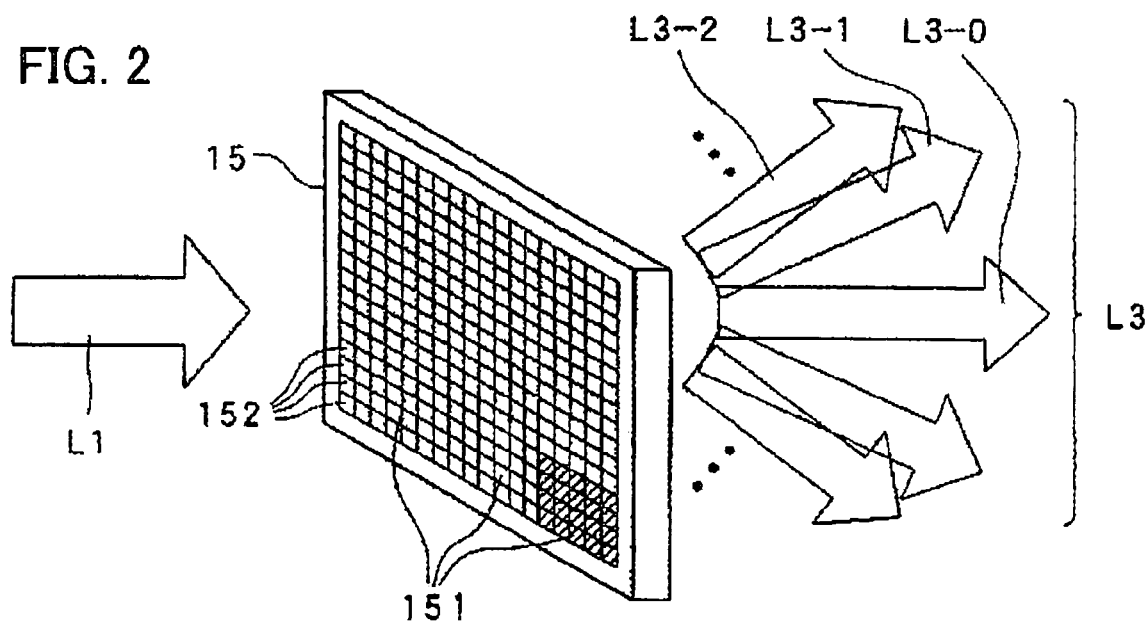
FIG. 2 is a perspective view schematically illustrating the spatial light modulator employed in the first embodiment.

Firstly, with reference to FIG. 1 and FIG. 2, the entire configuration of the hologram record apparatus of the present invention will be discussed. FIG. 1 illustrates the entire configuration of the hologram record apparatus of the present invention. FIG. 2 illustrates schematically and perspectively the spatial light modulator employed in the embodiment.

As shown in FIG. 1, the hologram record apparatus 100 in the first embodiment is provided with: a laser device 11 as an example of the record light source for performing the irradiation with the source light L0 made of laser light; a beam splitter 12 as an example of the optical system for splitting the source light L0 into the signal light L1 and the reference light L2; a lens 13 constructing an example of the optical system for enlarging the diameter of the signal light L1; a lens 14 such as a collimator lens for parallelizing the signal light L1 outputted from the lens 13; a spatial light modulator 15 for modulating (Fourier Transform) the signal light L1 outputted from the lens 14, in response to the record signal to be recorded, and outputting it as the modulated signal light L3; and a lens 16 as an example of the optical system for changing the diameter of the signal light L3 and outputting it to the hologram record medium 200.

The hologram record apparatus 100 is further provided with a mirror 17 as an example of the optical system for introducing the reference light L2 split by the beam splitter 12 to a position the same as the focus position of the signal light L3 corresponding to the reference light L2, on the hologram record medium 200.

As shown in FIG. 2, the spatial light modulator 15 may be made of a liquid crystal device and divided into a plurality of cell blocks 151 arranged in a matrix. Each cell block 151 is divided into a plurality of cells 152 arranged in a matrix of M by N (each of M and N is natural number not less than 2). The modulation is performable cell by cell (i.e. by unit of a cell 152). Incidentally, in FIG. 2, an example of one cell block 151 is indicated as a set of cross-hatched cells 152. For example, if the spatial light modulator 15 is an active matrix type LCD, a plurality of cells 152 is defined corresponding to a plurality of pixel-electrodes arranged in a two-dimension matrix. For example, the spatial light modulator 15 is made of a plurality of cells 152 arranged in a rectangular or square. Each cell block 151 is defined by a part of cells 152, the part having also a square or rectangular shape. For example, one cell block 151 is made of cells in a matrix of 5 by 5. If the signal light L1 is inputted into the spatial light modulator 15 due to the diffraction depending on the size of the cell block 151, the modulator 15 outputs the signal light L3 made of the modulated diffraction light including the zeroth-order light L3-0 and the higher-order light such as the first-order light L3-1, the second-order light L3-2, etc.

In FIG. 1 again, the hologram record apparatus 100 is further provided with the control device 18 for controlling the spatial light modulator 15 so as to modulate the signal light L1, by a modulation unit of cells 152 occupying a part of each cell block 151 of the spatial light modulator 15, depending on each of a plurality of record information to be recorded onto the hologram record medium 200.

Figure 3:
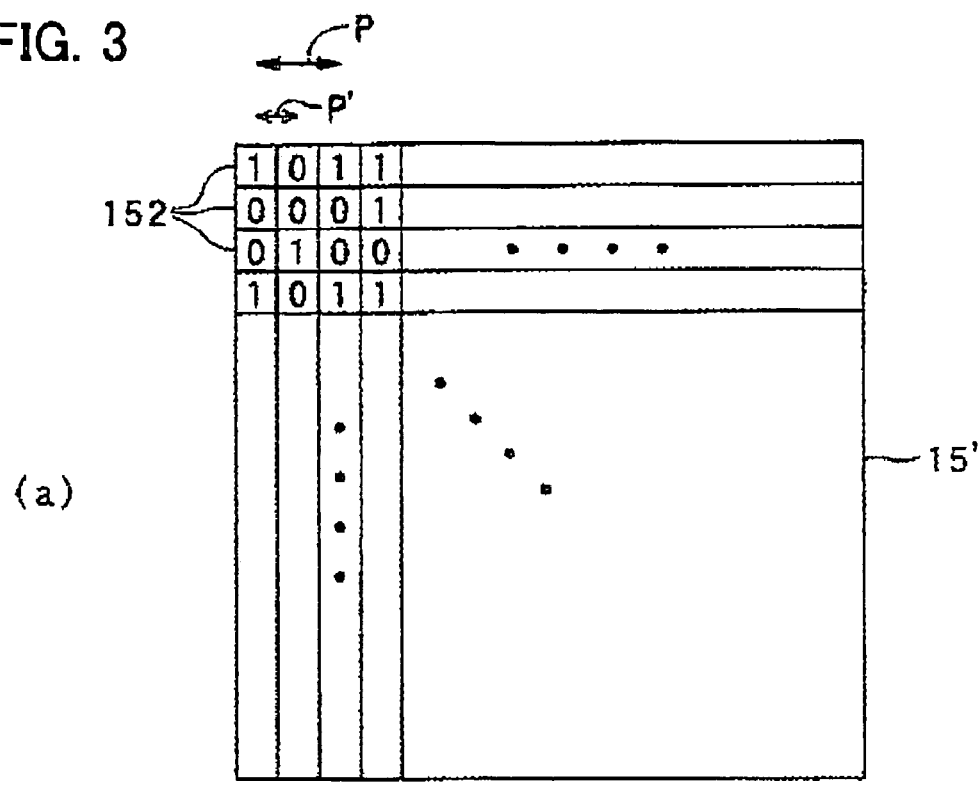
FIG. 3 includes a schematic plan view of a spatial light modulator in a comparative embodiment (FIG. 3(a)), a schematic partial sectional view thereof (FIG. 3(b)) and a schematic plan view illustrating a relationship between diffraction light on the hologram record medium in the comparative embodiment and a required size for the hologram record medium (FIG. 3(c)).
Figure 3:
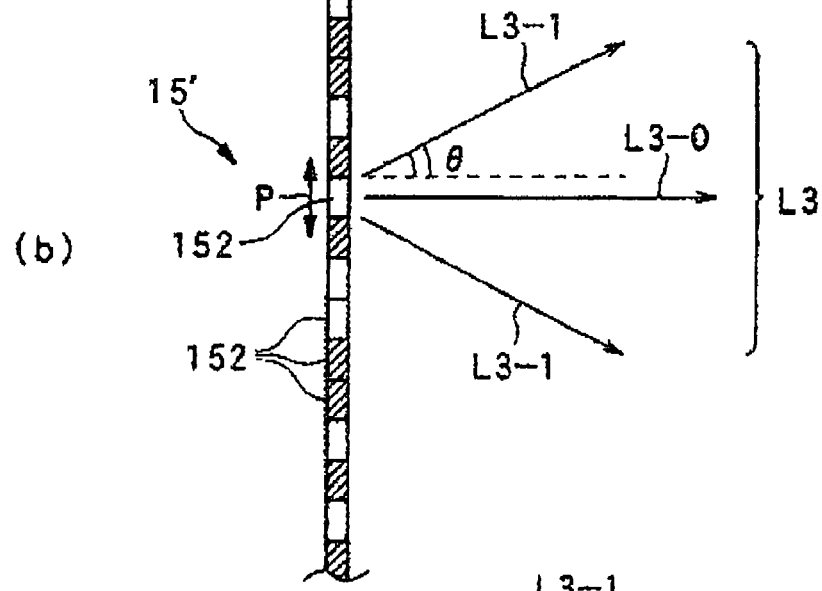
Figure 3:
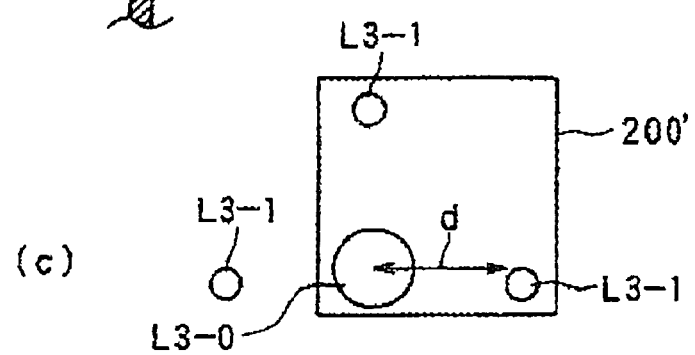
Figure 4:
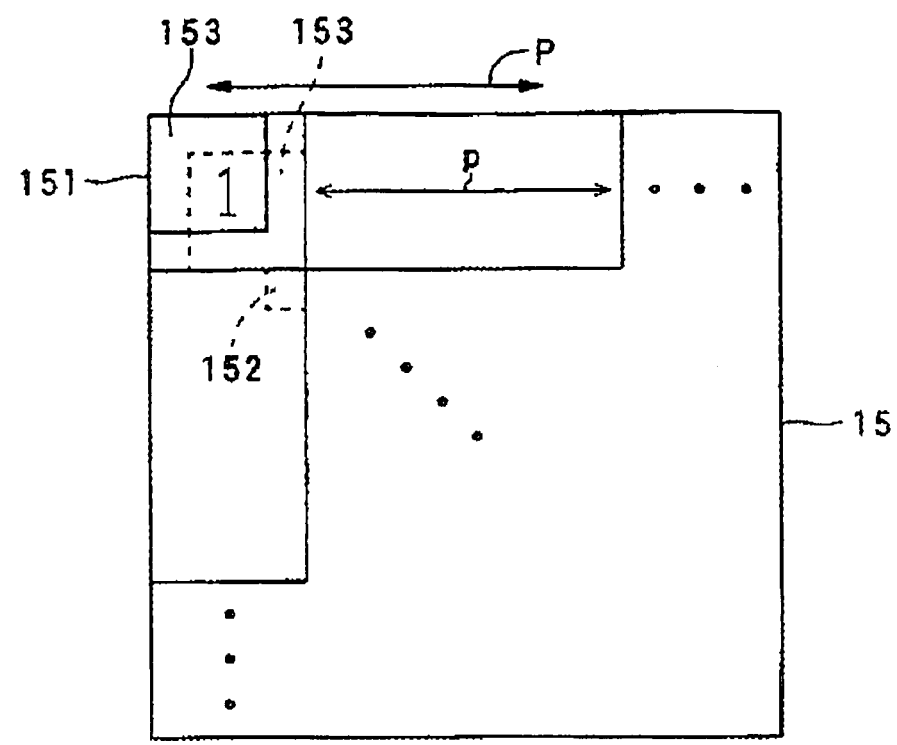
FIG. 4 includes a schematic plan view of a spatial light modulator in the first embodiment (FIG. 4(a)), a schematic partial sectional view thereof (FIG. 4(b)) and a schematic plan view illustrating a relationship between diffraction light on the hologram record medium in the first embodiment and a required size for the hologram record medium (FIG. 4(c)).
Figure 4:
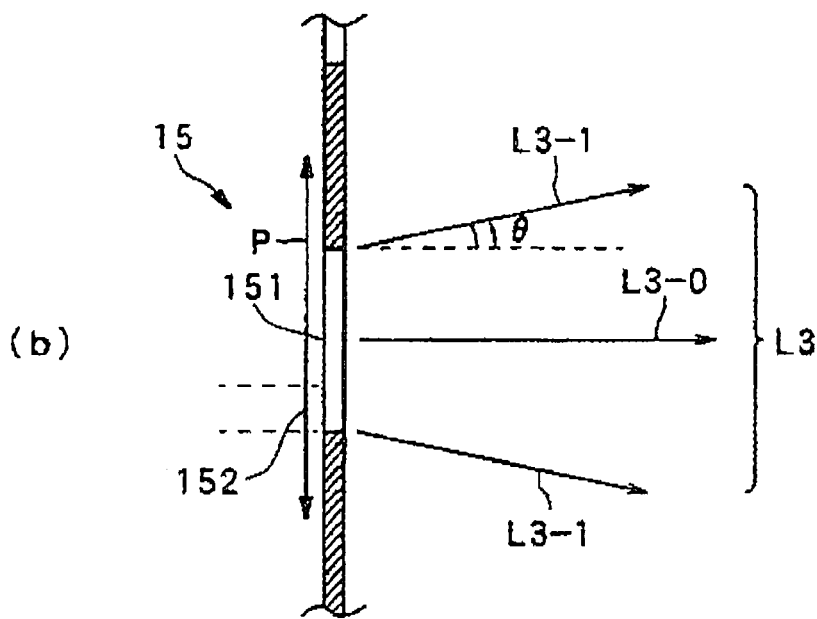
Figure 4:
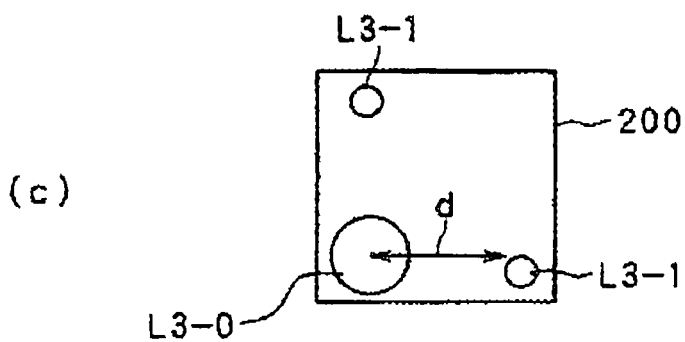

Next, the record principle in the first embodiment will be discussed, with reference to FIG. 3 and FIG. 4. FIG. 3(a) illustrates a schematic plan view of a cell pitch p' and a light-dark pattern shortest pitch P in a spatial light modulator 15' in a comparative embodiment. FIG. 3(b) schematically illustrates a partial sectional view of the spatial light modulator 15' in the comparative embodiment, showing a relationship between the shortest pitch P and the output angle θ of the first-order light L3-1. FIG. 3(c) illustrates a schematic plan view of a hologram record medium 200' in the comparative embodiment, showing a relationship between a required size for the hologram record medium 200' and the zeroth-order light L3-0 and the first-order light L3-1 on the hologram record medium 200'. On the other hand, FIG. 4(a) illustrates a schematic plan view of the spatial light modulator 15 in the first embodiment, showing a plurality of modulation units 153 defined overlappingly in the cell block 151, and showing a cell pitch p' and a light-dark pattern shortest pitch P. FIG. 4(b) schematically illustrates a partial sectional view of the spatial light modulator 15 in the first embodiment, showing a relationship between the shortest pitch P and the output angle θ of the first-order light L3-1. FIG. 4(c) illustrates a schematic plan view of a hologram record medium 200 in the first embodiment, showing a relationship between a required size for the hologram record medium 200, and the zeroth-order light L3-0 as well as the first-order light L3-1 on the hologram record medium 200.

As shown in FIG. 3(a), in the spatial light modulator 15' in the comparative embodiment, the modulation is performed depending on the record information to be recorded for each cell 152. That is, the cell 152' as the physically modulatable minimum unit is directly used as the modulation unit. As shown in FIG. 3(b), in the spatial light modulator 15' constructed as such, since the light-dark pattern shortest pitch P defining the diffraction extent is relatively small, the output angle (the diffraction angle) θ of the diffracted first-order light L3-1 is relatively big. For this, as shown in FIG. 3(c), in order to use the zeroth-order light L3-0 and the first-order light L3-1 constructing the signal light L3 from the spatial light modulator 15' for the hologram recording, the size of the hologram record medium 200' itself is required to be enlarged.

More specifically, since the output angle θ is defined by a formula $\sin\theta = \lambda/P$ (wherein $\lambda$=wavelength of the signal light L1), the angle θ becomes bigger as the light-dark pattern shortest pitch P becomes smaller. In response to this, the distance d between the zeroth-order light L3-0 and the first-order light L3-1 is defined by a formula d=f·tan θ (wherein f=focal distance), and thereby the distance d becomes longer as the output angle θ becomes bigger. Therefore, in the comparative embodiment, since the light-dark pattern shortest pitch P is small, the distance d becomes long. For example, the distance d becomes about 1 mm.

Incidentally, in this comparative embodiment, only one of four first-order lights L3-1 arisen from the spatial light modulator 15' is used as the first-order light L3-1.

As opposed to this, as shown in FIG. 4(a), in the spatial light modulator 15 in the first embodiment, the modulation is not performed depending on the record information to be recorded for each cell 152. Instead, another modulation is performed depending on the record information to be recorded, for each set of cells 152 as a modulation unit, the set being defined within the cell block 151 made of a plurality of cells 152 and being smaller than the cell block 151. In FIG. 4(a), two modulation units 153 are depicted, one is depicted by a solid line at the upper left corner of the cell block 151 and the other is depicted by a dotted line at the lower right corner of the cell block 151. In practice, there are another modulation unit at the upper right corner and still another modulation unit at the lower left corner in the same cell block 151, as mentioned later, That is, the modulation is not performed on the basis of the cell 152, which is the physically modulatable minimum unit, as the modulation unit, but the modulation is performed on the basis of the set of cells as the modulation unit, while the modulation unit 153 is gradually shifted in the same cell block 151. As shown in FIG. 4(b), in the spatial light modulator 15 constructed as such, since the light-dark pattern shortest pitch P defining the diffraction extent is relatively big, the output angle (diffraction angle) θ of the diffracted first-order light L3-1 is relatively small. For this, as shown in FIG. 4(c), in order to use the zeroth-order light L3-0 and the first-order light L3-1 constructing the signal light L3 from the spatial light modulator 15 for the hologram recording, the size of the hologram record medium 200 itself is not required to be enlarged as seen in the comparative embodiment shown in FIG. 3. For example, the distance d becomes about 20–100 μm.

More specifically, the output angle θ defined, similarly to the aforementioned comparative embodiment, by the formula sin θ=λ/P becomes smaller, as the light-dark pattern shortest pitch P becomes bigger proportional to the ratio of the cell block size to the cell size. In response to this, the distance d between the zeroth-order light L3-0 and the first-order light L3-1 defined, similarly to the aforementioned comparative embodiment, by the formula d=f·tan θ becomes shorter, as the output angle θ becomes smaller. Therefore, in this embodiment, the distance d can be shorter, because the modulation unit is bigger than that of the comparative embodiment.

Incidentally, in the first embodiment, only one of four first-order lights L3-1 arisen from the spatial light modulator 15 is used, as the first-order light L3-1.

As shown in FIG. 3 and FIG. 4, in the first embodiment, the hologram recording is performable in the record area smaller than that of the comparative embodiment. Furthermore, as explained below, the recordable information volume can be almost the same as the comparative embodiment, even if the record area is small.

Figure 5:
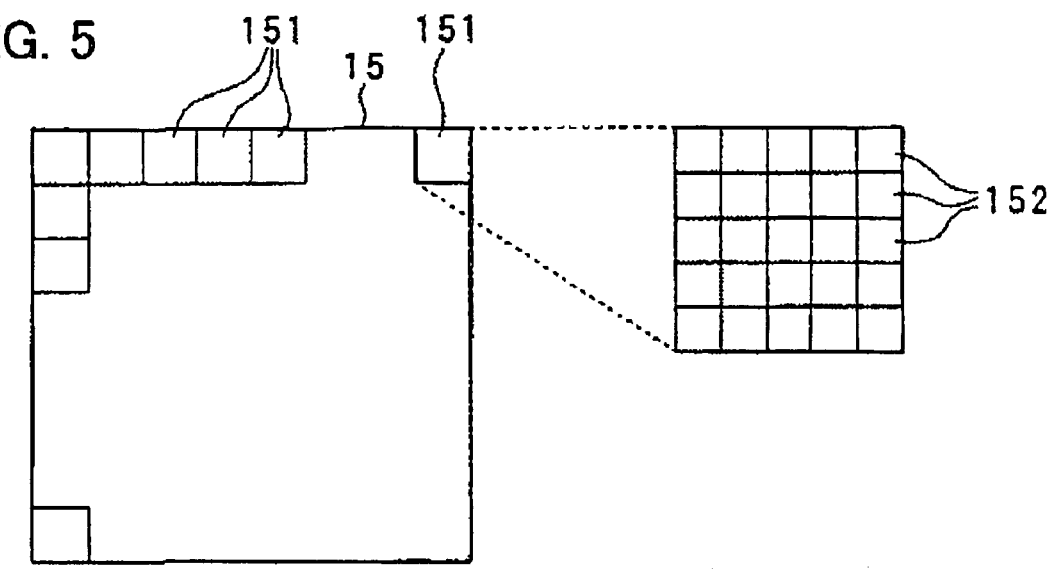
FIG. 5 is a schematic plan view illustrating a cell block structure of the spatial light modulator in the first embodiment and a cell structure in one cell block.
Figure 6:
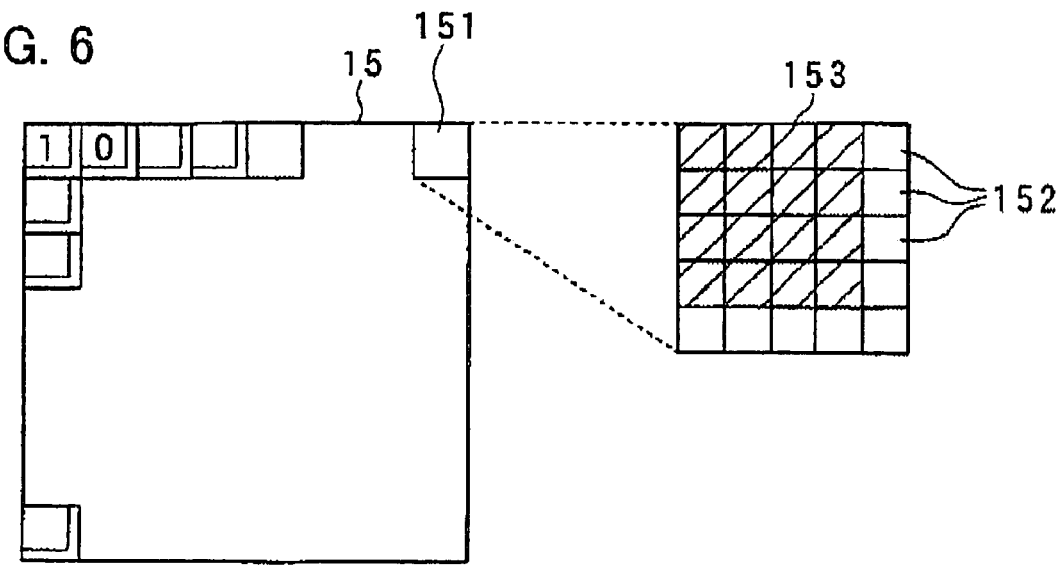
FIG. 6 is a schematic plan view illustrating a modulation unit at the first time of the recording for the same record area on the hologram record medium corresponding to the same cell block in the first embodiment.
Figure 7:
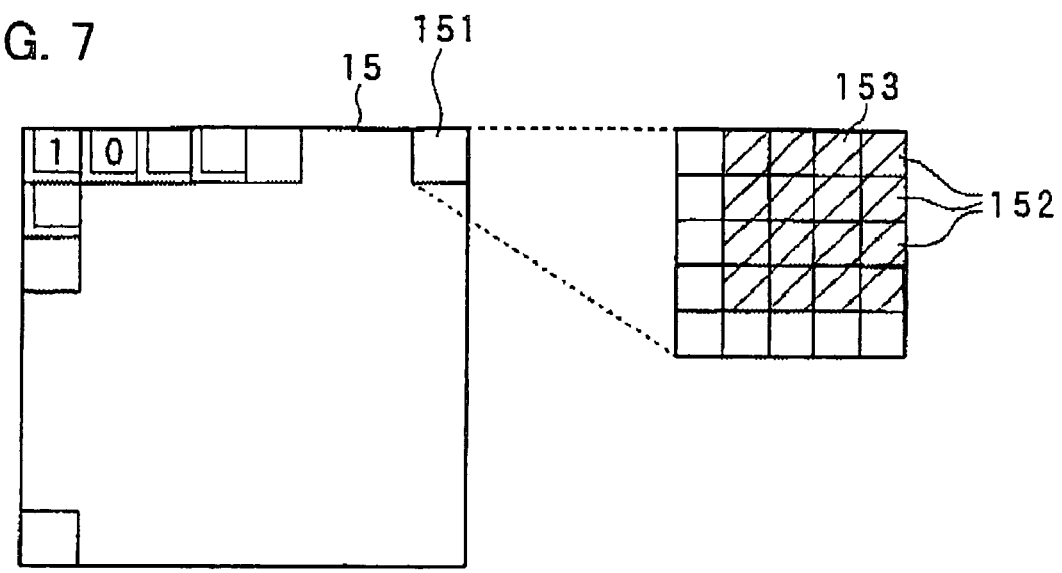
FIG. 7 is a schematic plan view illustrating a modulation unit at the second time of the recording for the same record area on the hologram record medium corresponding to the same cell block in the first embodiment.
Figure 8:
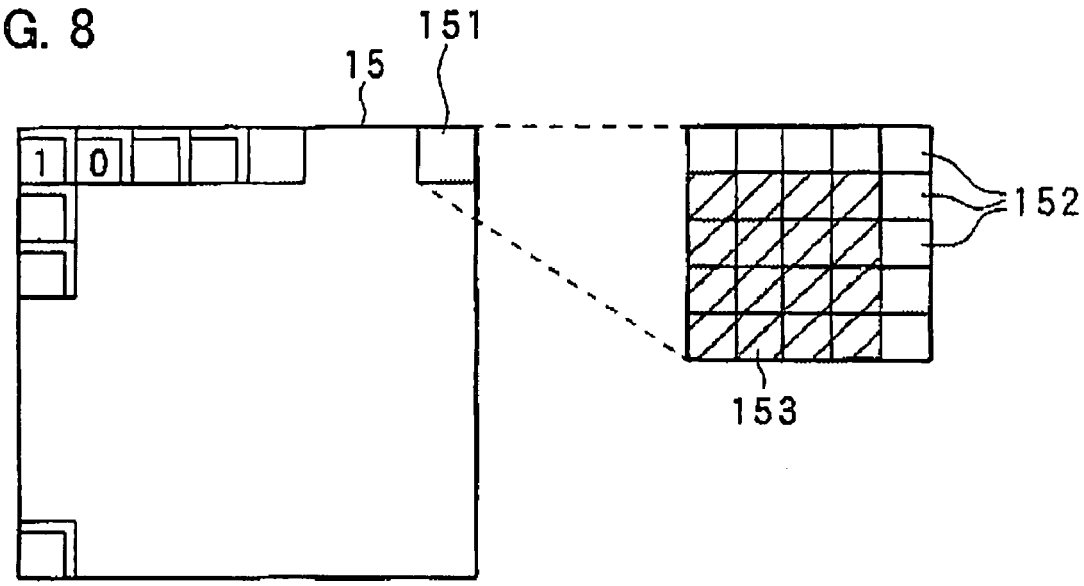
FIG. 8 is a schematic plan view illustrating a modulation unit at the third time of the recording for the same record area on the hologram record medium corresponding to the same cell block in the first embodiment.
Figure 9:
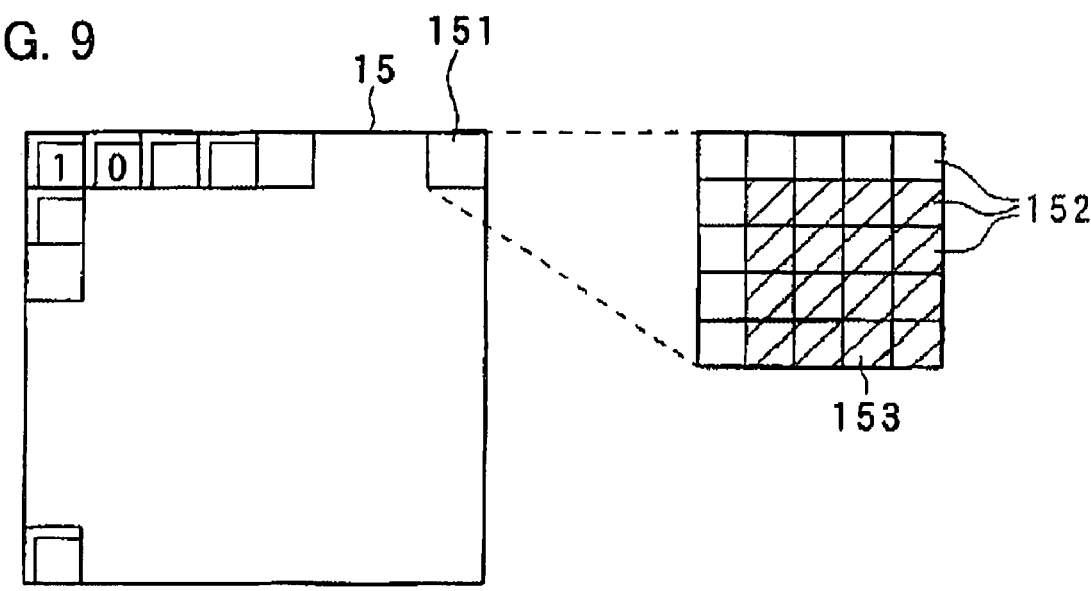
FIG. 9 is a schematic plan view illustrating a modulation unit at the fourth time of the recording for the same record area on the hologram record medium corresponding to the same cell block in the first embodiment.

With reference to FIG. 5 to FIG. 9, the record principle and the record operation in the first embodiment allowing the high density recording will be explained. Here, FIG. 5 illustrates schematic plan views showing a structure of the cell block 151 of the spatial light modulator 15 in the first embodiment and a structure of the cells 152 in one cell block 151. FIG. 6 illustrates a schematic plan view of the modulation unit 153 for the first recording to the same record area on the hologram record medium 200 corresponding to the same cell block 151. FIG. 7 illustrates a schematic plan view of the modulation unit 153 for the second recording to the same record area on the hologram record medium 200 corresponding to the same cell block 151. FIG. 8 illustrates a schematic plan view of the modulation unit 153 for the third recording to the same record area on the hologram record medium 200 corresponding to the same cell block 151. FIG. 9 illustrates a schematic plan view of the modulation unit 153 for the fourth recording to the same record area on the hologram record medium 200 corresponding to the same cell block 151.

As shown in FIG. 5, in this embodiment, the spatial light modulator 15 may include cell blocks 151 in a matrix of 65 by 65, for example. Each cell block 151 may include cells 152 in a matrix of 5 by 5, for example.

As shown in FIG. 6, for the first recording to each record area on the hologram record medium 200 corresponding to each cell block 151, the modulation is performed on the basis of the modulation unit 153 made of cells 152 in a matrix of 4 by 4 shown as a hatched portion at the upper left corner of the each cell block 151 in the figure. That is, the modulation is performed depending on the record information indicating binary data 0 or 1, for each modulation unit 153. Then, the recording is performed to the hologram record medium 200, due to the interference of the signal light L3 modulated as such and the reference light L2 (see FIG. 1).

Next, as shown in FIG. 7, for the second recording, the modulation is performed on the basis of the modulation unit 153 made of cells 152 in a matrix of 4 by 4 shown as a hatched portion at the upper right corner of the each cell block 151 in the figure. That is, the modulation is performed depending on the record information indicating binary data 0 or 1, for each modulation unit 153. Then, the recording is performed to the record area the same as that of the first recording on the hologram record medium 200, due to the interference of the signal light L3 modulated as such and the reference light L2.

Next, as shown in FIG. 8, for the third recording, the modulation is performed on the basis of the modulation unit 153 made of cells 152 in a matrix of 4 by 4 shown as a hatched portion at the lower left corner of the each cell block 151 in the figure. That is, the modulation is performed depending on the record information indicating binary data 0 or 1, for each modulation unit 153. Then, the recording is performed to the record area the same as that of the first and second recording on the hologram record medium 200, due to the interference of the signal light L3 modulated as such and the reference light L2.

Next, as shown in FIG. 9, for the fourth recording, the modulation is performed on the basis of the modulation unit 153 made of cells 152 in a matrix of 4 by 4 shown as a hatched portion at the lower right corner of the each cell block 151 in the figure. That is, the modulation is performed depending on the record information indicating binary data 0 or 1, for each modulation unit 153. Then, the recording is performed to the record area the same as that of the first to third recording on the hologram record medium 200, due to the interference of the signal light L3 modulated as such and the reference light L2.

Figure 10:
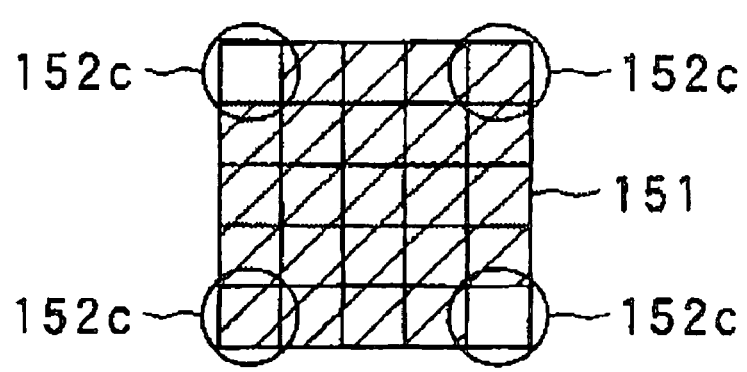
FIG. 10 is a schematic plan view of the cell block illustrating a light-dark pattern at four corners in one cell block.
Figure 11:
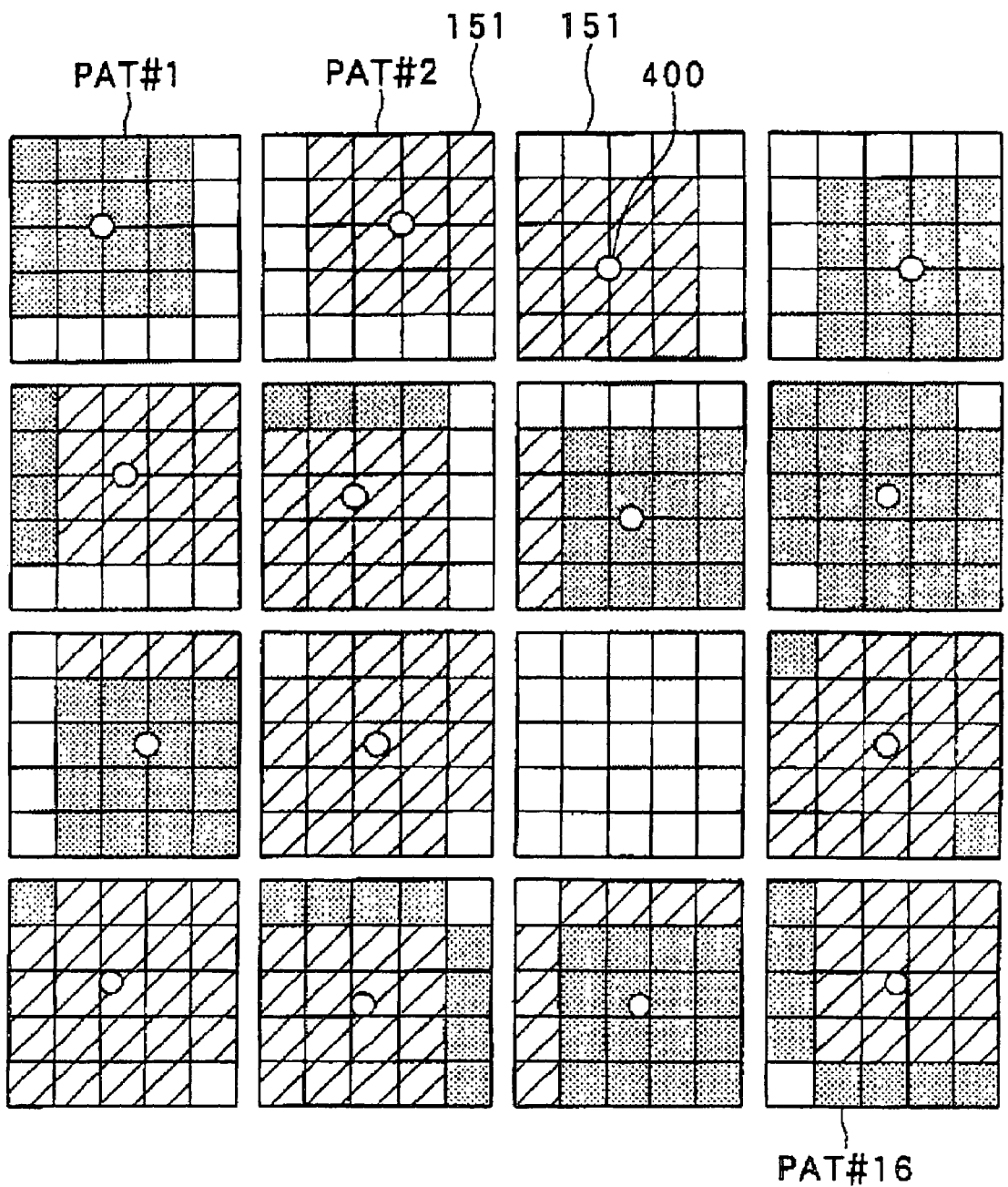
FIG. 11 is a view illustrating 16 kinds of the light-dark pattern recordable in the first embodiment for each cell block.

The record principle and the record operation in the first embodiment is further explained, with reference to FIG. 10 and FIG. 11. FIG. 10 illustrates a schematic plan view of a cell block showing a light-dark pattern at four corners in one cell block. FIG. 11 illustrates 16 kinds of light-dark pattern, which may be recorded in the first embodiment, for each cell block.

As shown in FIG. 6 to FIG. 9, although the first to fourth recordings are performed overlappingly to the record area corresponding to the same cell block 151, the first to fourth recordings are not performed overlappingly as for cells 152c positioned at four corners of each cell block 151. Therefore, focusing on the information recorded by means of cells 152c at four corners, the record information recorded by any of the first to fourth recordings can be distinguished from each other and can be reproduced as the record information at the same time.

Alternatively, as shown in FIG. 11, if the recordings are performed overlappingly on the basis of four modulation units 153 in the same cell block 151, 16 kinds of light-dark pattern can be recorded. However, these light-dark patterns are uniquely different from each other, as shown in the figure. For this, if these 16 kinds of light-dark pattern are identified, a combination of record information overlappingly recorded four times can be identified. That is, it can be identified that the record information of which recording corresponds to which value ("light" or "dark", or "0" or "1"). Therefore, even if the recordings are performed overlappingly to the record area corresponding to the same cell block 151, the recorded information can be reproduced as the record information during the reproduction by the hologram reproduction apparatus mentioned below.

For example, in the case of light-dark pattern PAT#1 in FIG. 11, the value of the record information recorded in the first recording is "1" (dark), the values of the record information recorded in the second to fourth recordings are all "0" (light). In the case of light-dark pattern PAT#2 in FIG. 11, the value of the record information recorded in the first recording is "0" (light), the value of the record information recorded in the second recording is "1" (dark), and the values of the record information recorded in the third and fourth recordings are "0" (light). Furthermore, in the case of light-dark pattern PAT#16 in FIG. 11, the value of the record information recorded in the first recording is "1" (dark), the value of the record information recorded in the second recording is "1" (dark), the value of the record information recorded in the third recording is "0" (light) and the value of the record information recorded in the fourth recording is "1" (dark).

If a combination of the light-dark pattern and each record information value is predetermined experimentally, empirically, theoretically, mathematically or by a simulation, for example if a correspondence table is generated and stored in a memory, the reproduction can be performed more quickly and readily by the hologram reproduction apparatus mentioned below.

Incidentally, since an interference pattern actually recorded on the hologram record medium 200 is based on the Fourier transformed signal light and the reference light, the pattern causes a light pattern shown in FIG. 8 on the reproduction and has a more complicated pattern. However, in the hologram reproduction apparatus mentioned below, the reproduction light having a light-dark pattern the same as that of the spatial light modulator 15 is detected, the interference pattern itself recorded on the hologram record medium 200 need not to be specially concerned.

Additionally, in FIG. 11, barycenter positions 400 of dark portions are individually indicated as circles for each light-dark pattern. These barycenter positions 400 are generally different among patterns. For this, a part of record information values of four recordings can be identified even by these barycenter positions 400. If position information about the barycenter positions 400 is used redundantly or subsidiarily in the case that the contents of the record information is identified at least by the aforementioned light-dark pattern, a further accurate reproduction can be performed. Similarly, totally judging the recorded position, the brightness and so on makes it possible to perform a further accurate reproduction.

Next, with reference to FIG. 1 to FIG. 11, the record operation of the hologram record apparatus 100 in this embodiment constructed as such will be explained.

During the operation, the laser device 11 irradiates the source light L0, the beam splitter 12 splits the source light L0 into the signal light L1 and the reference light L2. Then, the signal light L1 enter the spatial light modulator 15 after the diameter of L1 is adapted to the spatial light modulator 15 by lenses 13 and 14. Then, the spatial light modulator 15 modulates the signal light L1, by a modulation unit 153 (see FIG. 6 to FIG. 9) made of cells 152 arranged in 4 by 4 matrix in each cell block 151, depending on each of a plurality of record information to be recorded, under control of the control device 18. Then, the modulated signal light L3 is collected at the lens 16 and then irradiated, with the reference light reflected on the mirror 17, onto the record area of the hologram record medium 200. Then, these lights interfere to each other so that the record information to be recorded is holographically recorded as a wavefront. Such a record operation is overlappingly repeated four times by the signal light L3 modulated on the basis of four modulation units 153, to the same record area of the hologram record medium 200 corresponding to the same cell block 151 (see FIG. 6 to FIG. 9). In this case, one recording is performed simultaneously for all cell blocks 151 arranged in a matrix of 65 by 65. The simultaneous recording for all cell blocks 151 is repeated four times in parallel.

As the result, to the same record area, the recording corresponding to any of light-dark patterns shown in FIG. 11 is performed. Then, since such a hologram recording is simultaneously performed for all cell blocks 151, the record information of 65 by 65 by 4 bits can be recorded by four times simultaneous recording. Thus, in the first embodiment, the benefit of the distributed type memory is fully reflected.

During such a record operation, as shown in FIG. 4, since the output angle θ of the first-order light or the higher-order light is relatively small and the distance d between the first-order light or the higher-order light and the zeroth-order light in the record area is short, such a hologram recording can be performed in a relatively small record area. Therefore, the laser power required for the laser device 11 can be reduced, which is practically very advantageous in view of costs and so on, for example. Furthermore, even if a plurality of record information is recorded overlappingly to the same record area, a high accuracy reproduction is performable by the hologram reproduction apparatus explained below.

As the result, comparing to the comparative embodiment shown in FIG. 3, the record density can be improved while the record area becomes smaller. Thereby, the record capacity can be increased and the entire apparatus can be downsized and lightened.

Particularly in the first embodiment, the spatial light modulator 15 performs a binary modulation depending on the binary data indicated by the record information for each modulation unit 153, under control of the control device 18. Thereby, the record information indicating the binary data can be recorded at a high density onto the hologram record medium 200. In this embodiment, however, the spatial light modulator 15 can perform a multi-value level modulation depending on the gray scale data indicated by the record information for each modulation unit 153, under control of the control device 18. Thereby, the record information indicating the gray scale data can be recorded at a high density onto the hologram record medium 200.

Incidentally, materials for the hologram record medium may be known inorganic materials, or may be organic materials (polymer materials). Furthermore, the hologram record medium may be a card-like medium, or a disc-like medium.

(Second Embodiment of Hologram Record Apparatus)

Figure 12:
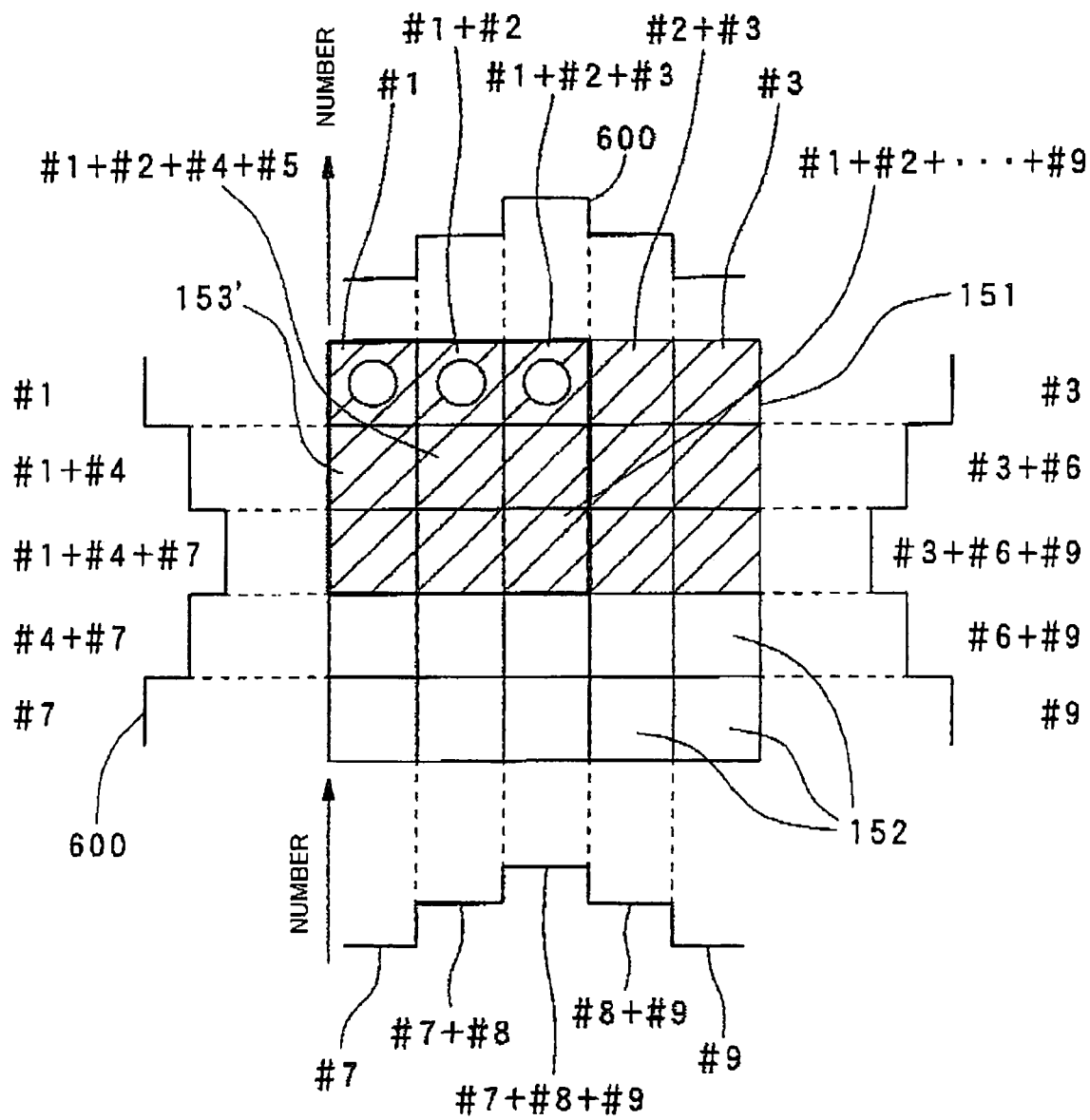
FIG. 12 is a schematic plan view of one cell block illustrating a cell block in the second embodiment and the modulation unit, and a modulation unit serial number associated with each cell with arrows.
Figure 13:
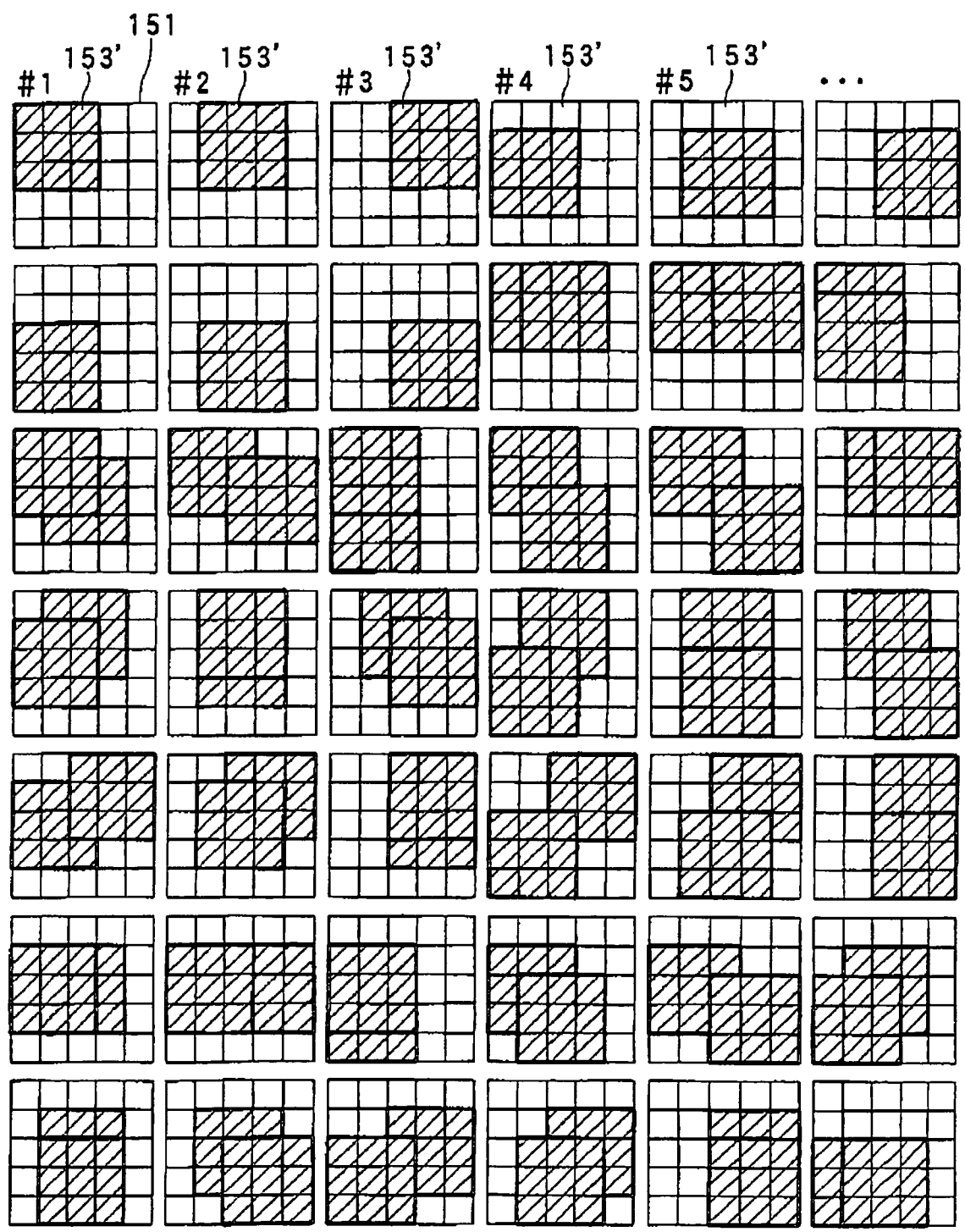
FIG. 13 is a view illustrating 42 kinds of the light-dark pattern recordable in the second embodiment.

The second embodiment of the hologram record apparatus according to the present invention will be discussed, with reference to FIG. 12 and FIG. 13. FIG. 12 illustrates cell blocks and modulation units in the second embodiment, in a schematic plan view of one cell block indicating a serial number of the modulation unit corresponding to each cell with arrows. FIG. 13 illustrates, for each cell block, 42 kinds of light-dark pattern from among a plurality of light-dark patterns recordable in the second embodiment.

The second embodiment is different from the first embodiment, in the configuration of the modulation unit 153 defined in the cell block 151 of the spatial light modulator 15. Other parts of the structure are the same as the first embodiment.

As shown in FIG. 12, in the second embodiment, the modulation unit 153' made of cells 152 in a 3 by 3 matrix is defined as for the cell block 151 made of cells 152 in a 5 by 5 matrix. In this case, 9 kinds of modulation unit 153' exist in the same cell block 151.

Therefore, as shown in FIG. 13, these 9 kinds of modulation unit 153' are combined to perform 9 recordings overlappingly as for the same record area corresponding to the same cell block 151, so that any of light-dark patterns including 42 kinds of light-dark pattern is holographically recorded.

Since these light-dark patterns are also unique for a combination of record information relating to 9 time recordings, contents of all the record information can be identified, by identifying these light-dark patterns by the hologram reproduction apparatus mentioned below. That is, all the record information, which is holographically recorded, can be reproduced.

Also in FIG. 12, the modulation unit 1513 for each cell 152 is indicated by a serial number with an arrow. The serial number #1, #2, #3, etc. of the modulation unit 151 are continuously given corresponding to an array of modulation unit 153 from left to right in one line and from top to down. For example, the value of the record information recorded on the basis of the first modulation unit 153 (#1) can be identified by whether the upper left corner cell 152 is light or dark, the value of the record information recorded on the basis of the third modulation unit 153 (#3) can be identified by whether the upper right corner cell 152 is light or dark, the value of the record information recorded on the basis of the seventh modulation unit 153 (#7) can be identified by whether the lower left corner cell 152 is light or dark, and the value of the record information recorded on the basis of the ninth modulation unit 153 (#9) can be identified by whether the lower right corner cell 152 is light or dark. Furthermore, the record information recorded on the basis of the second(#2), fourth(#4), sixth(#6) and eighth(#8) modulation unit 153 can be identified by adding parts adjacent to these four corners. Furthermore, the record information recorded on the basis of the fifth modulation unit 153 (#5) can be identified by adding a cell 152 located at the center of the cell block 151. Furthermore, in FIG. 12, total numbers of modulation units 153' for each cell are indicated by a stepwise line 600 corresponding to each cell position.

Thus, by performing overlappingly 9 modulations on the basis of 9 kinds of modulation unit 153' in one cell block 151, 9 bits can be recorded in the record area on the hologram record medium 200 corresponding to the cell block 151.

Additionally, the recording may be performed without using the modulation unit 153 that makes the identification of the light-dark pattern relatively difficult or the high accurate reproduction difficult For example, if it is predetermined that the recording is not performed with using the fifth modulation unit 153 (#5)(i.e. the central modulation unit of the cell block 151), 9 light-dark patterns, (1) recordings on the basis of the first(#1), second(#2), and fourth(#4) modulation units 153, (2) recordings on the basis of the first(#1), second(#2), third(#3), fourth(#4)and sixth(#6) modulation units 153, (3) recordings on the basis of the second(#2), third(#3) and sixth(#6) modulation units 153, (4) recordings on the basis of the first(#1), second(#2), fourth(#4), seventh(#7) and eighth(#8) modulation units 153, (5) recordings on the basis of the first(#1), second(#2), fourth(#4), sixth(#6), seventh(#7), eighth(#8) and ninth(#9) modulation units 153, and so on are obtained at cell portion made of 3 by 3 matrix around the center of the cell block 151, so that the high accurate reproduction is performable.

As shown in FIG. 11 and FIG. 12, the first to ninth recordings are overlappingly performed to the same record area corresponding to the same cell block 151, so that any of light-dark patterns including 42 kinds of light-dark pattern is recorded. For this, if the corresponding light-dark pattern can be identified on the reproduction, the corresponding combination of record information recorded by 9 time recordings can be identified and the corresponding value of the record information ("light" or "dark", or "0" or "1") can be identified. Therefore, even if the recordings are performed overlappingly in the same record area corresponding to the same cell block, they can be simultaneously reproduced as the record information during the reproduction by the hologram reproduction apparatus mentioned below.

Alternatively, in the case that the aforementioned fifth recording is not performed, the first to fourth and the sixth to ninth recordings are overlappingly performed in the same record area corresponding to the same cell block 151, so that any of nine light-dark patterns is recorded. For this, if the corresponding pattern is identified from among nine patterns, the corresponding combination is identified from among the record information overlappingly recorded in 8 time recordings and the corresponding value (i.e. "light" or "dark", or "0" or "1") of the record information can be identified.

Incidentally, the recordings in the same record area corresponding to the same cell block 151 in the second embodiment are preferably performed for all the cell blocks 151, similarly to the first embodiment, so that the simultaneous recordings for all the cell blocks 151 are performed 9 times in parallel.

(Third Embodiment of Hologram Record Apparatus)

Figure 14:
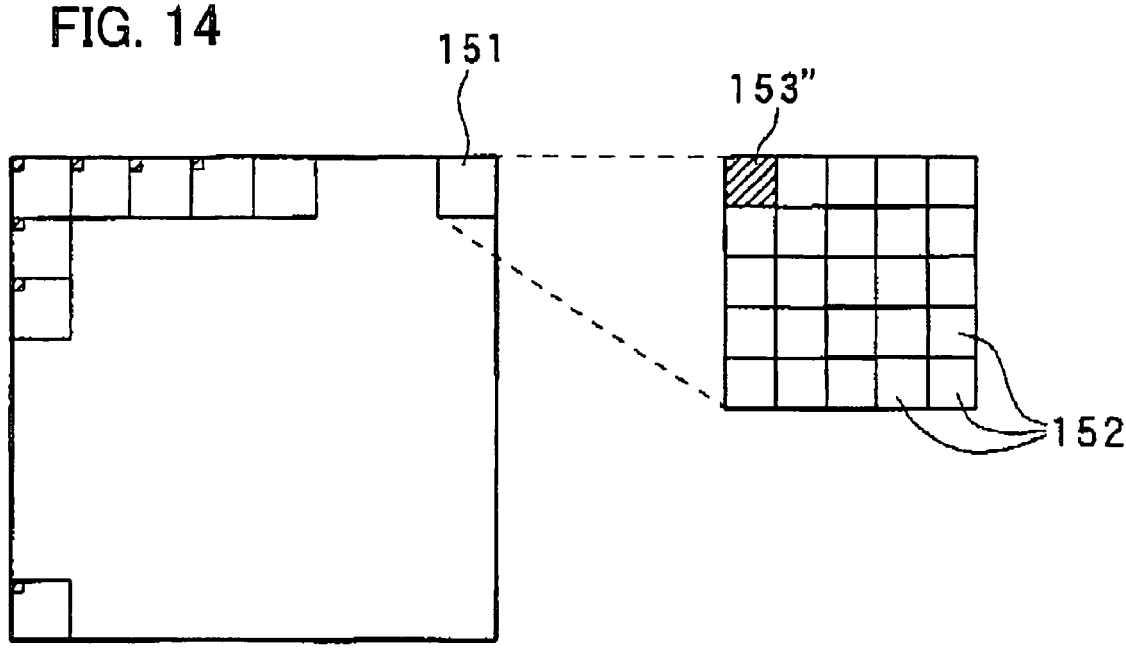
FIG. 14 is a schematic plan view illustrating a modulation unit at the first time of the recording for the same record area on the hologram record medium corresponding to the same cell block in the third embodiment.
Figure 15:
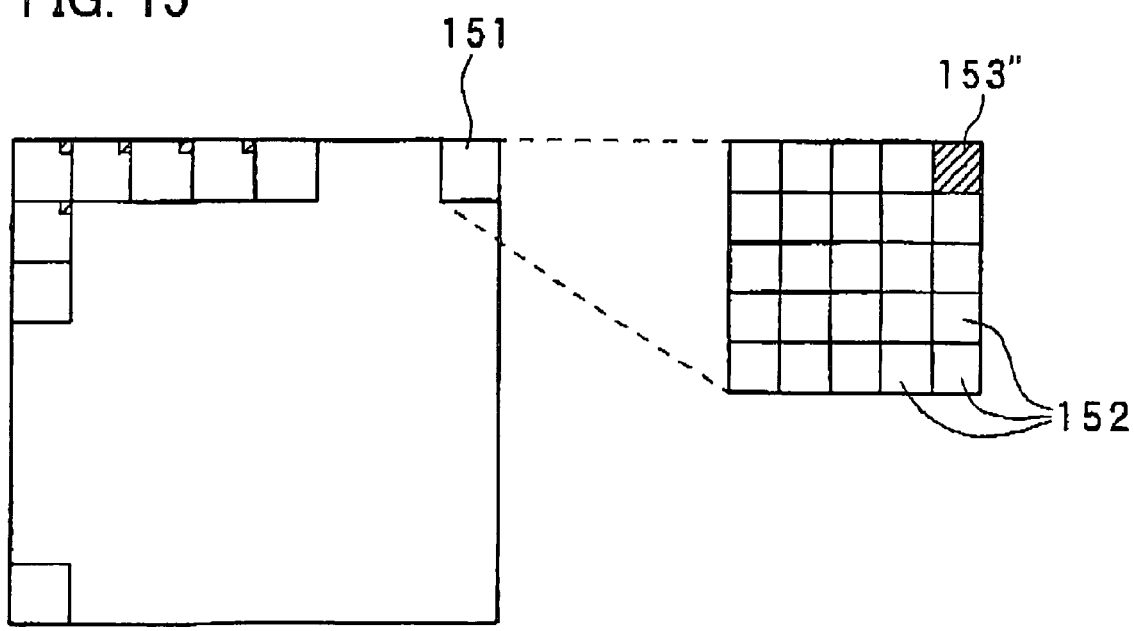
FIG. 15 is a schematic plan view illustrating a modulation unit at the fifth time of the recording in the third embodiment.

The third embodiment of the hologram record apparatus according to the present invention will be discussed, with reference to FIG. 14 and FIG. 15. FIG. 14 illustrates a schematic plan view of the modulation unit 153" for the first recording in the same record area on the hologram record medium 200 corresponding to the cell block 151 of the spatial light modulator 15 in the third embodiment. FIG. 15 illustrates a schematic plan view of the modulation unit 153" for the fifth recording in the third embodiment.

The third embodiment is different from the first embodiment in the configuration of the modulation unit 153" defined in the cell block 151 of the spatial light modulator 15. Other parts of the structure are the same as the first embodiment.

As shown in FIG. 14 and FIG. 15, in the third embodiment, the modulation unit 153" made of one cell 152 is defined for the cell block 151 made of cells 152 in a 5 by 5 matrix. In this case, 25 kinds of modulation unit 153" exist in the same cell block 151.

Thus, even in the case that the modulation unit is made of an individual cell 152, the recordings on the basis of the modulation units 153" in the same cell block 151 are performed 25 times in the same record area corresponding to the same cell block, so that the appropriate reproduction is performable at an improved record density.

Incidentally, the recordings in the same record area corresponding to the same cell block 151 in the third embodiment are preferably simultaneously performed for all the cell blocks 151, similarly to the first embodiment, so that the simultaneous recordings for all the cell blocks 151 are performed 25 times in parallel.

(Modification in Hologram Record Apparatus)

Incidentally, in each embodiment mentioned above, it is possible to integrate an angle-multiplex type system for performing multiplex-recordings with various incident angles of the signal light L1 onto the hologram record medium 200. In this case, for example, the angle of the laser device 11 or other optical elements such as lenses 13, 14 and 16 may be changed or additional optical elements for the angle change may be added, otherwise a mechanical element for changing the angle of the hologram record medium 200 may be added in order to change the incident angle, so that the hologram recordings similar to the aforementioned recording are overlappingly performed in the same record area for each incident angle.

Instead of or in addition to such an angle-multiplex type system, it is possible to employ a reference light phase-multiplex type system for performing multiplex-recordings with various phases of the reference light L2. In this case, for example, an optical element for changing the phase may be disposed in an optical path of the reference light L2 in order to change the phase of the reference light L2, so that the hologram recording similar to the aforementioned recording are overlappingly performed in the same record area for each phase.

Furthermore, instead of or in addition to these multiple type systems, it is possible to employ a reference light amplitude-multiplex type system for performing multiplex-recordings with various amplitudes of the reference light L2. In this case, for example, an optical element for changing the amplitude may be disposed in an optical path of the reference light L2 in order to change the amplitude of the reference light L2, so that the hologram recordings similar to the aforementioned recording are overlappingly performed in the same record area for each amplitude.

Furthermore, instead of or in addition to these multiple type systems, it is possible to employ a reference light polarization-multiplex type system for performing multiplex-recordings with various polarizations of the reference light L2. In this case, for example, an optical element for changing the polarization may be disposed in an optical path of the reference light L2 in order to change the polarization of the reference light L2, so that the hologram recordings similar to the aforementioned recording are overlappingly performed in the same record area for each polarization.

Furthermore, instead of or in addition to these multiple type systems, it is possible to employ a focal-depth-multiplex type system for performing multiplex-recordings with various focal depths of the signal light L3. In this case, for example, the position of the laser device 11 or other optical elements such as lenses 13, 14 and 16 may be changed, or an optical element for changing the focal distance may be added, otherwise a mechanical element for changing the position of the hologram record medium 200, in order to change the focal depth, so that the hologram recordings similar to the aforementioned recording are overlappingly performed in the same record area for each focal depth.

According to these modifications, comparing to each embodiment mentioned above, a further high density hologram recording is performable.

(Embodiments of Hologram Reproduction Apparatus)

Figure 16:
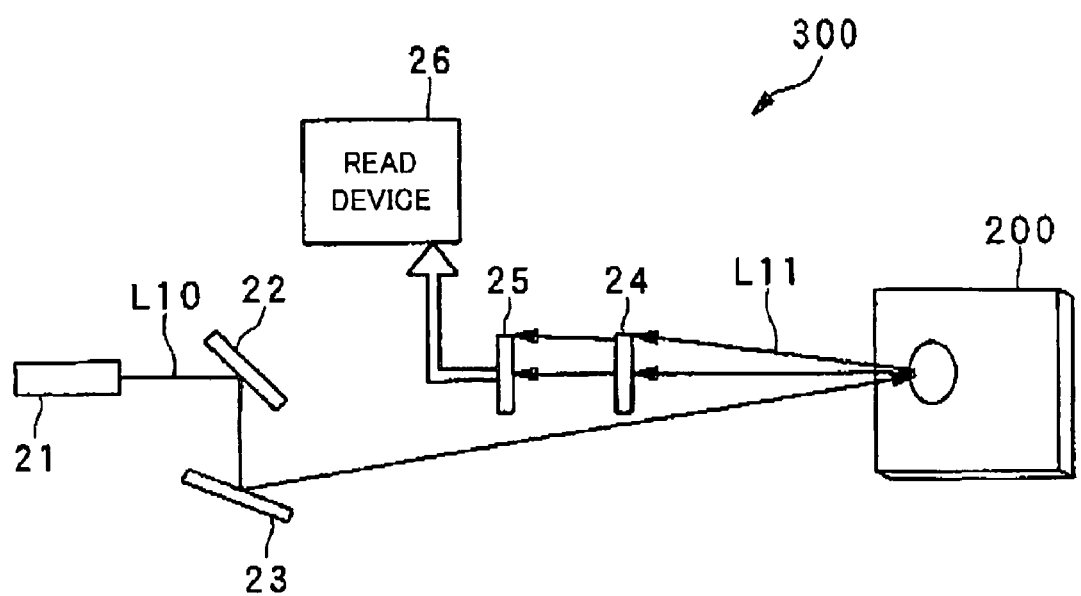
FIG. 16 is a block diagram illustrating an entire configuration of an example of the hologram reproduction apparatus of the present invention.

Embodiments of the hologram reproduction apparatus according to the present invention will be discussed, with reference to FIG. 16. FIG. 16 illustrates an entire configuration of the hologram reproduction apparatus in this embodiment.

The hologram reproduction apparatus 300 in this embodiment is for reading out the record information from the hologram record medium 200 recorded by the hologram record apparatus 100 of the aforementioned embodiment.

As shown in FIG. 16, the hologram reproduction apparatus 300 is provided with: a laser device 21, as an example of the reproduction light source such as a semiconductor laser, for irradiating the hologram record medium 200 with the reproduction illumination light L10; mirrors 22 and 23 for introducing the reproduction illumination light L10 onto the hologram record medium 200; a lens 24 for collecting the reproduction light based on the reproduction illumination light; a photoreceptor 25 for receiving the reproduction light L11 via the lens 24; and a reading device 26 for reading a plurality of record information overlappingly recorded on the hologram record medium 200, on the basis of the received reproduction light L11.

The photoreceptor 25 may include a photodiode array, a CCD (Charge Coupled Device) and the like.

The reading device 26 preferably stores a table into the memory, the table indicating the light-dark patterns shown in FIG. 10 to FIG. 13, the modulation units 153 (or 153', 153"), and a relationship between the light-dark patterns and the values of each record information modulated on the basis of the modulation unit. Then, the light-dark pattern of the received reproduction light L11 is identified, the table is referred, and thereby the record information corresponding to the identified light-dark pattern is identified, so that each record information is read. Therefore, a plurality of record information overlappingly recorded a plurality of times can be simultaneously read.

Next, the operation of the hologram reproduction apparatus 300 according to the present invention will be discussed.

In FIG. 16, during the operation, the laser device 21 irradiates the hologram 200 with the reproduction illumination light L10 via mirrors 22 and 23. Then, the photoreceptor 25 receives the reproduction light L11 based on the reproduction illumination light L10 on the hologram record medium 200. The reproduction light L11 herein means zeroth-order light or higher-order light such as the first-order light, which is caused when the reproduction illumination light L10 corresponding to the reference light for the recording is irradiated onto the hologram record medium 200. Depending on the property of the hologram recording, the reproduction light L11 has a light-dark pattern the same as that of the modulated signal light L3 shown in FIG. 1.

Next, the reading device 26 may refer to the aforementioned table on the basis of the reproduction light L11 received at the photoreceptor 25, and thereby identifies each modulation unit 153 (or 153', 153") overlappingly recorded in the same record area, and identifies the contents of the record information recorded for each modulation unit (i.e. a binary data value or gray scale data value). Thereby, each record information recorded at high density on the hologram record medium 200 is reproduced.

The reproductions of each record information to the same record area is preferably performed simultaneously for all the record area on the hologram record medium 200. Thereby, the benefit of the hologram record medium 200 as a distributed memory is effectively obtained.

Incidentally, in the hologram reproduction apparatus 300 in this embodiment, the reading device 26 may detect the barycenter position of the dark portion or light portion of the reproduction light L11 or detect the total light amount, and read the record information on the basis thereof. In this arrangement, according to the record principle of the present invention explained with reference to FIG. 11 and the like, comparing to the information reproduction only by the reproduction pattern, the accuracy in the reproduction can be effectively improved. Alternatively, the reading device 26 may detect the light part from predetermined areas such as four corners in the cell block and read the record information on the basis thereof. In this arrangement, according to the record principle of the present invention explained with reference to FIG. 10 and the like, the accuracy in the reproduction can be effectively improved.

Furthermore, the reading device 26 may detect the intensity distribution of the reproduction light L11 and read the record information on the basis thereof. In this arrangement, according to the record principle explained with reference to FIG. 12 and the like, the accuracy in the reproduction can be effectively improved Alternatively, the gray scale data can be recorded and reproduced.

As discussed above, according to the hologram record apparatus and the hologram reproduction apparatus of the invention, the record density and the record capacity can be improved, and suitable for downsizing. Particularly, the power of the light source can be saved, and the apparatus structure or apparatus control can be simplified.

The present invention is not limited to the aforementioned embodiments, but may be changed or modified as appropriate without departing from the essence or spirit of the invention read from claims and the whole specification. Such a changed or modified hologram record apparatus and the reproduction apparatus are also encompassed within the technical scope of the invention.

INDUSTRIAL APPLICABILITY

The hologram record apparatus and the hologram reproduction apparatus according to the present invention are applicable to various record apparatuses for irradiating the downsizable hologram record medium with the signal light and thereby recording a great volume of information at high density, the information including various contents information such as video information or audio information, various data information for computer, control information and so on, and applicable to various reproduction apparatuses for irradiating the downsizable hologram record medium with the reproduction light and thereby reproducing the great volume of information recorded at high density.

The invention claimed is:

1. A hologram record apparatus comprising:
a record light source for performing an irradiation with source light including signal light and reference light;
a spatial light modulator disposed in an optical path of the signal light and divided into a plurality of cell blocks arranged in a matrix, each cell block divided into a plurality of cells arranged in a matrix of M by N (M, N=natural number not less than 2);
an optical system for introducing the signal light passed through the spatial light modulator and the reference light onto a hologram record medium; and
a control device for controlling the spatial light modulator to modulate the signal light using one or more cells occupying a part of each cell block as modulation units, depending on each of a plurality of record information to be recorded onto the hologram record medium, wherein
the control device controls the spatial light modulator to record the plurality of record information overlappingly one after another, in each of a plurality of record areas corresponding to the plurality of cell blocks on the hologram record medium, by using the signal light modulated by the modulation units, and the modulation units exist in each cell block and have different cell patterns respectively.

2. The hologram record apparatus according to claim 1, wherein the spatial light modulator performs the recordings of the plurality of record information in parallel for each cell block.

3. The hologram record apparatus according to claim 1, wherein each modulation unit is made of cells arranged in a predetermined pattern in each cell block.

4. The hologram record apparatus according to claim 3, wherein each modulation unit is made of cells arranged in a matrix of n by m, n=natural number not more than N, m=natural number not more than M, and n+m<N+M.

5. The hologram record apparatus according to claim 1, wherein each modulation unit is made of an individual cell in each cell block.

6. The hologram record apparatus according to claim 1, wherein the control device controls the spatial light modulator to perform a binary modulation depending on binary data indicated by the record information, by using the modulation units.

7. The hologram record apparatus according to claim 1, wherein the control device controls the spatial light modulator to perform a multi-value level modulation depending on gray scale data indicated by the record information, by using the modulation units.

8. The hologram record apparatus according to claim 1, wherein at least one of an angle-multiplex system for performing multiple recordings by changing an incidence angle of the signal light entering the hologram record medium, a reference light phase-multiplex system for performing multiple recordings by changing a phase of the reference light, a reference light amplitude-multiplex system for performing multiple recordings by changing an amplitude of the reference light, a reference light polarization-multiplex system for performing multiple recordings by changing a polarization of the reference light, and a focal-depth-multiplex system for performing multiple recordings by changing a focal depth of the signal light entering the hologram record medium is performed to the same record area.

9. A hologram reproduction apparatus for reading record information from a hologram record medium recorded by a hologram record apparatus, the hologram record apparatus comprising: a record light source for performing an irradiation with source light including signal light and reference light; a spatial light modulator disposed in an optical path of the signal light and divided into a plurality of cell blocks arranged in a matrix, each cell block divided into a plurality of cells arranged in a matrix of M by N (M, N=natural number not less than 2); an optical system for introducing the signal light passed through the spatial light modulator and the reference light onto the hologram record medium; a control device for controlling the spatial light modulator to modulate the signal light using one or more cells occupying a part of each cell block as modulation units, depending on each of a plurality of record information to be recorded onto the hologram record medium; the control device controlling the spatial light modulator to record the plurality of record information overlappingly one after another, in each of a plurality of record areas corresponding to the plurality of cell blocks on the hologram record medium, by using the signal light modulated by the modulation units; and the modulation units existing in each cell block and having different cell patterns respectively, the hologram reproduction apparatus comprising:

a reproduction light source for irradiating the hologram record medium with reference illumination light;

a photoreceptor for receiving reproduction light based on the reproduction illumination light from the same record area corresponding to the same cell block of the hologram record medium; and a reading device for reading the plurality of record information recorded overlappingly in the same record area, on the basis of the received reproduction light, wherein the photoreceptor receives simultaneously the reproduction lights corresponding to the plurality of record information recorded overlappingly in the same record area, and the reading device reads simultaneously the plurality of record information recorded overlappingly in the same record area, on the basis of the simultaneously-received reproduction light.

10. The hologram reproduction apparatus according to claim 9, wherein the reading device reads the plurality of record information from the plurality of record areas corresponding to the plurality of cell blocks in parallel.

11. The hologram reproduction apparatus according to claim 9, wherein the reading device detects a barycenter of a dark portion or a light portion of the received reproduction light from the same record area, and reads the plurality of record information modulated on the basis of the modulation units in the same cell block, on the basis of the detected barycenter.

12. The hologram reproduction apparatus according to claim 9, wherein the reading device detects a light part which is included in the received reproduction light and which corresponds to a predetermined area in the same record area, and reads the record information on the basis of the detected light part.

13. The hologram reproduction apparatus according to claim 9, wherein the reading device detects a light-dark pattern of the reproduction light received from the same record area, and reads the plurality of record information modulated on the basis of the modulation units in the same cell block, on the basis of the detected lightdark pattern.

14. The hologram reproduction apparatus according to claim 9, wherein the reading device detects an intensity distribution of the reproduction light received from the same record area, and reads the plurality of record information modulated on the basis of the modulation units in the same cell block, on the basis of the detected intensity distribution.

15. The hologram reproduction apparatus according to claim 14, wherein the record information indicates gray scale data subjected to a multi-value level modulation, and the reading device reads the gray scale data, on the basis of the detected intensity distribution.

16. The hologram reproduction apparatus according to claim 9, wherein the reading device detects total amount of the reproduction light received from the same record area, and reads the plurality of record information modulated on the basis of the modulation units in the same cell block, on the basis of the detected total amount.

* * * * *